United States Patent [19]

Woltz

[11] 4,390,802
[45] Jun. 28, 1983

[54] LOW-VOLTAGE, HIGH-NOISE IMMUNITY I²L INTERFACE

[75] Inventor: Stephen H. Woltz, Plantation, Fla.

[73] Assignee: Motorola, Inc., Schaumburg, Ill.

[21] Appl. No.: 219,084

[22] Filed: Dec. 22, 1980

[51] Int. Cl.³ ................. H03K 19/091; H03K 19/092
[52] U.S. Cl. .................................. 307/475; 307/477; 357/92
[58] Field of Search ............... 307/459, 475, 477, 255, 307/313; 357/92

[56] References Cited

U.S. PATENT DOCUMENTS

| | | |
|---|---|---|
| Re. 29,962 | 4/1979 | Russell . |
| 4,032,902 | 6/1977 | Herndon ............................... 357/92 |
| 4,065,680 | 12/1977 | Russell ................................ 307/477 |
| 4,112,511 | 9/1978 | Heald . |
| 4,115,711 | 9/1978 | Moussie . |
| 4,130,826 | 12/1978 | Bachle et al. . |
| 4,137,109 | 1/1979 | Aiken et al. . |
| 4,158,782 | 6/1979 | Price, Jr. . |
| 4,180,749 | 12/1979 | Sloan . |

Primary Examiner—John Zazworsky
Attorney, Agent, or Firm—Donald B. Southard; Edward M. Roney; James W. Gillman

[57] ABSTRACT

An improved low-voltage, low-current, high-noise immunity I²L interface is disclosed for control of associated I²L logic circuitry, which interface does not require the inclusion of the heretofore conventional low-pass RC filter found in prior devices. As a result, considerable chip area previously occupied by such low-pass filters is now saved. Moreover, by isolating a portion of the interface switching circuitry from all other portions of the I²L circuitry a substantial reduction in source current is effected. This objective is accomplished by fabricating at least one of the I²L gates and its injector transistor in a separate epitaxial tub.

4 Claims, 3 Drawing Figures

LOW-VOLTAGE, HIGH-NOISE IMMUNITY I²L INTERFACE

BACKGROUND OF THE INVENTION

The present invention relates generally to integrated injection logic (I²L) circuits and, more particularly, to a low-voltage, high-noise immunity I²L interface which occupies a substantially reduced chip area than heretofore obtained.

I²L logic circuits have enjoyed ever increasing usage in recent years. Circuit density on integrated circuit chips has increased dramatically through I²L design techniques as well as permitting significant reductions in power consumption.

Frequently it is necessary to control the actuation of I²L circuitry from the outside world. That is, suitable switching must be provided, controllable by appropriate means, such as grounding or ungrounding of a bonding pad accessible from outside the associated integrated circuit chip. When interfacing an I²L circuit to the outside world on an integrated circuit, a large injection current, as well as the necessity of incorporating a low-pass RC network (see FIG. 1) is required for each I²L gate whose base is connected directly to an associated chip bonding pad.

These precautions are unavoidable and are necessary to prevent any printed circuit board leakage currents and any RF signal energy, which may otherwise be coupled into the pad, from seriously degrading circuit performance. However, the incorporation of the low-pass filter results in a considerable area of the IC chip being occupied. Further, the increased injection current constitutes an undesirable drain on the IC chip itself.

SUMMARY OF THE INVENTION

Accordingly, it is an object of the present invention to provide an improved low-voltage, high-noise immunity I²L interface which overcomes the foregoing deficiencies.

Another object of the present invention is to provide an improved I²L interface of the foregoing type which does not require a low-pass RC filter so as to conserve chip area and yet provide a high degree of noise immunity to the circuitry.

Still another object of the present invention is to provide an improved I²L interface of the foregoing type which includes a switching arrangement effectively isolated from both ground and other I²L circuitry.

In practicing the invention, a differential transistor pair is provided which is of a first conductivity type and wherein a current source provides an injector current to the emitter electrodes thereof in parallel. Two additional transistors are provided which are of the opposite conductivity type to the differential pair. The collector of each differential pair transistor is connected to the base of the third and fourth transistors, respectively. The base of one of the differential pair transistors and the emitter of the fourth transistor are connected to ground while the base of the other differential pair transistor and the emitter of the third transistor are connected in common to the associated bonding pad. The collector of the third transistor is connected to the base of the fourth transistor, whose collector is then adapted to be connected to the associated I²L logic circuitry to be controlled by a selective grounding of the bonding pad. When the bonding pad is ungrounded, the first and third transistors coupled thereto are off and the fourth transistor sinks base drive away from a control transistor in the next stage, thereby turning it off. When the bonding pad is effectively grounded, the first, second and third transistors of the interface are conductive and the current source divides between the two parallel paths. The result is that the differential pair transistor providing base current for the fourth transistor is now sinked by the third transistor, which turns the fourth transistor off and the control transistor of the next stage is thereby allowed to turn on.

BRIEF DESCRIPTION OF THE DRAWINGS

The features of this invention which are believed to be novel are set forth with particularity in the appended claims. The invention, itself, together with its further objects and advantages thereof, may be best understood by reference to the following description when taken in conjunction with accompanying drawings, in which:

DETAILED DESCRIPTION OF THE DRAWINGS

Figure 1:
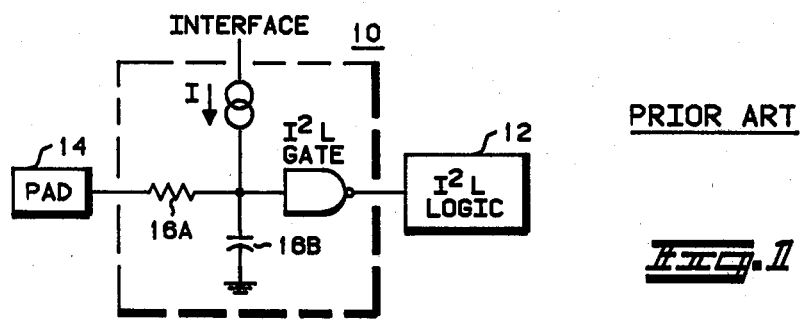
FIG. 1 is a partial schematic and block diagram indicating the functional placement of an interface with respect to an I²L logic circuit which may typically be found in the prior art.

Referring now to FIG. 1, there is illustrated a conventional interface 10 for controlling associated I²L logic circuitry 12 by the action of an integrated circuit bonding pad 14 accessible to the outside world. As shown, the integrated circuit pad 14 is selectively grounded or left floating so as to control the actuation of I²L circuitry 12. As further indicated, interface 10 in prior devices conventionally required a low-pass RC filter 16 consisting of resistance 16a and capacitance 16b connected as illustrated. The filter 16 is necessary since radiated RF signal energy can readily be picked up by the connections external to the bonding pad 14 and allowed to degrade circuit performance of the controlled I²L circuitry. However, the use of the low-pass filter 16 results in a considerable chip area being occupied, as well as an undue and certainly undesirable current drain on the IC chip itself.

Moreover, relatively large injector currents into the interface device are required if proper operation is to be ensured in the presence of any printed circuit board leakage currents and, also, if adequate noise protection is to be effectively maintained. That is, the injector current must be fairly large relative to the internal I²L logic devices being controlled.

Figure 2:
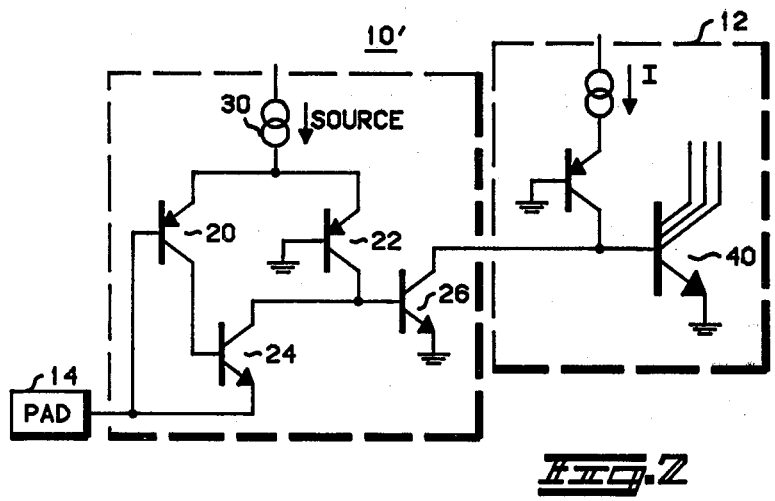
FIG. 2 is a circuit diagram of a preferred embodiment of a like circuit arrangement which has been constructed in accordance with the present invention.

An improved I²L interface 10' in accordance with the present invention is shown in FIG. 2 which eliminates entirely the low-pass RF filter 16 of FIG. 1 and where good noise immunity is assured with reduced injector current. The interface 10' of FIG. 2 includes transistors 20 and 22 forming a differential pair of the same conductivity type, say for example, PNP transistors. A further pair of transistors 24 and 26 are provided of the opposite conductivity type, in this case, NPN transistors. The emitter of transistor 24 is connected to bonding pad 14, as is the base of transistor 20, which further has its collector connected to the base of transistor 24.

The collector of transistor 22, the collector of transistor 24 and the base of transistor 26 are all interconnected, with the base of transistor 22 and the emitter of transistor 26 being connected to ground. The emitters of transistors 20 and 22 are connected together and are supplied by a constant current source 30 which biases the remainder of the chip. The collector of transistor 26 is adapted for connection to the next stage for selective control thereof in a manner to be described subsequently.

Transistors 24 and 26 function effectively as separate I²L gates, each having its own PNP injector, i.e., transistors 20 and 22, respectively. When the IC pad 14 sees a large resistance to ground, transistors 20 and 24 are effectively rendered non-conductive. Accordingly, current source 30 flows into transistor 22 which then provides base drive for transistor 26. It will be appreciated that the conduction of transistor 26 effectively sinks base drive from the control transistor of the next stage, here identified as a multiple-collector transistor 40. Transistor 40 is thus rendered non-conductive.

It will be appreciated that switching of I²L circuitry 12 occurs when the resistance from pad 14 to ground is reduced to a point where the emitter of transistor 24 and the base of transistor 20 are brought within a predetermined voltage to ground, say, for example, 60 millivolts. At this juncture, transistors 20 and 24 begin to conduct and the current source 30 now divides between parallel paths represented by transistors 20 and 22. In this operable condition, transistor 20 provides base drive for transistor 24, which in turn sinks the collector current of transistor 22, thereby rendering transistor 26 non-conductive. Turning off transistor 26, thereby permits base drive to be applied to control transistor 40, which operates to turn it on.

As will be understood, the interface 10' of FIG. 2 completely eliminates the need for the low-pass RC filter 16 of FIG. 1 which is typical of prior art structures. In one IC chip using I²L circuitry, the interface comprised of filter 16 and the I²L gate as shown in FIG. 1, an area of approximately 148 square mils was occupied. With the interface 10' as shown in FIG. 2, comprising transistors 20–26, the chip area approximated only 34 square mils.

Figure 3:
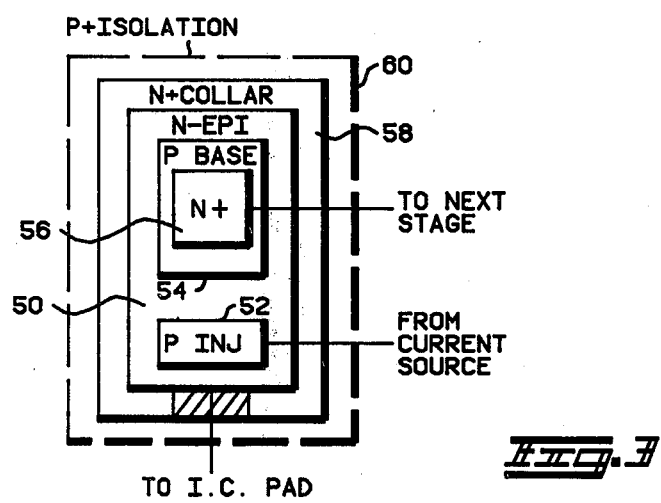
FIG. 3 is a graphic representation of an I²L gate and its injector transistor as being fabricated in their own epitaxial tub for isolation purposes.

As mentioned previously, relatively large injector currents heretofore have been required if adequate noise protection is to be maintained. In the main, the noise margin of an I²L gate is a function of both the magnitude of the injector currents and gate Beta. Nevertheless, in the interface 10' of FIG. 2, embodying the present invention, the magnitude of injector current is substantially reduced in comparison to prior devices, while still maintaining the desired level of noise protection. This objective is accomplished by fabricating the two transistors 20 and 24 in their own, separate epitaxial tub, completely isolated from the other transistors in the IC chip. FIG. 3 shows one way of meeting this design criteria. The base of PNP injector transistor 20 and the emitter of NPN transistor 24 are common to one another and are composed of the N-epitaxial region identified generally at 50. The emitter of PNP transistor 20 is composed of the P region at 52, while the collector of PNP transistor 20 is formed by the P region identified at 54. P region 54 also forms the base of transistor 24. The collector of transistor 24 is formed by the N+ region identified at 56. Transistors 20 and 24 are then surrounded by a suitable N+ collar region 58, which in turn is surrounded by a suitable P+ region 60. It has been found that with the foregoing described structure, current drain, or level of injector current, to interface 10' can be effectively reduced from, say a typical 5 microamps, to approximately 1.25 microamps, a reduction on the order of 75%.

Accordingly, it will be appreciated that an improved I²L gate interface has been disclosed and operatively described which requires substantially less chip area to be occupied by reason of eliminating entirely the conventional low-pass RC filter network of prior devices. Moreover, improved noise immunity is realized with substantially reduced current drain then heretofore possible. IC yields are effectively increased while fabrication costs are reduced without sacrifice in performance. The I²L gate interface in accordance with the present invention may be advantageously used in a wide variety of I²L applications which must be switched to ground at an IC pad. It is particularly adapted for those lower power applications, say, for example, in one-cell battery powered radio paging devices.

What is claimed is:

1. An improved integrated injection logic (I²L) interface adapted for switching associated I²L logic circuitry by selective grounding of an associated bonding pad, including in combination:

first and second transistors forming a differential pair, each transistor being of a first conductivity type and having base emitter and collector electrodes;

a constant current source for providing an injector current to said emitter electrodes of said differential transistor pair;

third and fourth transistors of a second conductivity type and having base emitter and collector electrodes; and means for connecting said base of said first transistor and said emitter of said third transistor to the associated bonding pad, for connecting said collector electrode of said first transistor to said base electrode of said third transistor, for interconnecting said collector electrode of said third transistor to said collector electrode of said second transistor and to said base electrode of said fourth transistor, and for connecting and permanently maintaining said base electrode of said second transistor and said emitter electrode of said fourth transistor at ground reference potential, said collector electrode of said fourth transistor being connected to the associated I²L logic circuitry for control thereof.

2. An improved integrated injection logic interface in accordance with claim 1 wherein said first and second transistors are of the PNP conductivity type and wherein said third and fourth transistors are of the NPN conductivity type.

3. An improved integrated injection logic interface in accordance with claim 1 wherein said first and third transistors are formed in their own separate spitaxial tub effectively isolated from other IC circuitry.

4. An improved integrated injection logic interface in accordance with claim 3 wherein the emitter of said first transistor is formed by a P region, the base of said first transistor and the emitter of said third transistor is formed by an N-epitaxial region, the collector of said first transistor and the base of said third transistor being formed by a P region, and the collector of said third transistor being formed by an N+ region, and wherein an N+ collar surrounds the components of said first and third transistors which in turn is surrounded by a P+ region.

* * * * *

UNITED STATES PATENT AND TRADEMARK OFFICE
CERTIFICATE OF CORRECTION

PATENT NO. : 4,390,802
DATED : JUN. 28, 1983
INVENTOR(S) : STEPHEN H. WOLTZ

It is certified that error appears in the above—identified patent and that said Letters Patent is hereby corrected as shown below:

Col. 4, line 55, "spitaxial" should be -- epitaxial --.

Signed and Sealed this

Seventh Day of February 1984

[SEAL]

Attest:

GERALD J. MOSSINGHOFF

Attesting Officer          Commissioner of Patents and Trademarks